United States Patent
Mowry

[11] Patent Number: 5,825,593
[45] Date of Patent: Oct. 20, 1998

[54] ELECTRIC FIELD MODULATED MR SENSOR

[75] Inventor: Gregory S. Mowry, Burnsville, Minn.

[73] Assignee: Seagate Technology, Inc., Scotts Valley, Calif.

[21] Appl. No.: 198,848

[22] Filed: Feb. 18, 1994

[51] Int. Cl.[6] .................................................. G11B 5/39
[52] U.S. Cl. .......................................... 360/113; 360/126
[58] Field of Search ................................... 360/113, 126; 324/207.21, 252, 207.25

[56] References Cited

U.S. PATENT DOCUMENTS

| | | | |
|---|---|---|---|
| 3,835,377 | 9/1974 | Kataoka | 324/46 |
| 3,855,625 | 12/1974 | Garnier et al. | 360/103 |
| 4,179,720 | 12/1979 | Miura | 360/113 |
| 4,816,947 | 3/1989 | Vinal et al. | 360/113 |
| 4,851,944 | 7/1989 | Mowry | 360/113 |
| 5,079,663 | 1/1992 | Ju et al. | 360/113 |
| 5,260,652 | 11/1993 | Collver et al. | 324/252 |

FOREIGN PATENT DOCUMENTS

| | | |
|---|---|---|
| 0 490 327 A1 | 6/1992 | European Pat. Off. . |
| 0 565 102 A2 | 10/1993 | European Pat. Off. . |
| 33 30 077 A1 | 2/1985 | Germany . |
| 57-131078 | 8/1982 | Japan .................................. 324/252 |
| 58-98826 | 6/1983 | Japan .................................. 360/113 |
| 58-211304 | 12/1983 | Japan .................................. 360/113 |
| 61-131204 | 6/1986 | Japan .................................. 360/113 |
| 61-170918 | 8/1986 | Japan . |
| 5-275769 | 10/1993 | Japan . |

OTHER PUBLICATIONS

IBM Tech. Disc. Bull., R. L. O'Day, "Balanced Magnetic Head", Feb. 1973, p. 2680.
*IBM Technical Disclosure Bulletin*, vol. 33, No. 3B, Aug. 1990, pp. 209–211.
Deeley, E. M., B.Sc., PhD., M.I.E.E., C.Eng., et al., *IEE Proceedings Section A to I*, Magnetoresistive Transducers for the Measurement of Magnetic Tape Speed, vol. 132. Pt. A, No. 1, Jan. 1985, pp. 33–39.

*Primary Examiner*—Stuart S. Levy
*Assistant Examiner*—Kevin M. Watkins
*Attorney, Agent, or Firm*—Kinney & Lange, P.A.

[57] ABSTRACT

An apparatus for sensing a change in a magnetic field is disclosed. The apparatus includes a giant magnetoresistive element positioned adjacent to the magnetic field. First, second, and third electrical contacts are spatially positioned on the giant magnetoresistive element forming a first current path having a first variable resistance between the first and second electrical contacts and a second current path having a second variable resistance between the first and third electrical contacts. The movable magnetic field causes a change in the first variable resistance in the first current path when the field becomes positioned substantially underneath the first current path, and the magnetic field causes a change in the second variable resistance in the second current path when the field becomes positioned substantially underneath the second current path.

20 Claims, 3 Drawing Sheets

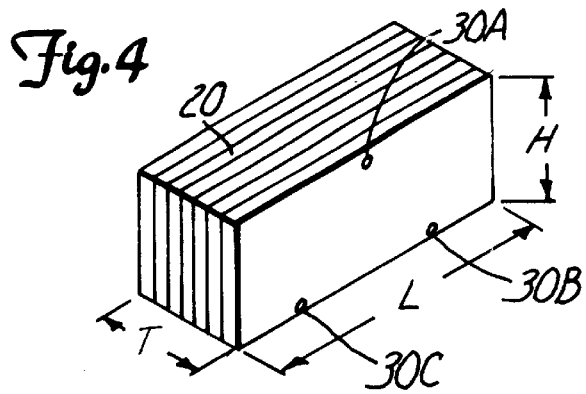
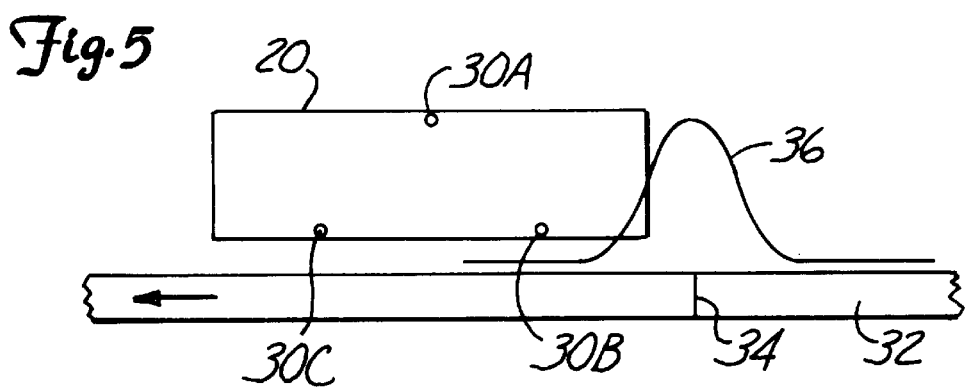
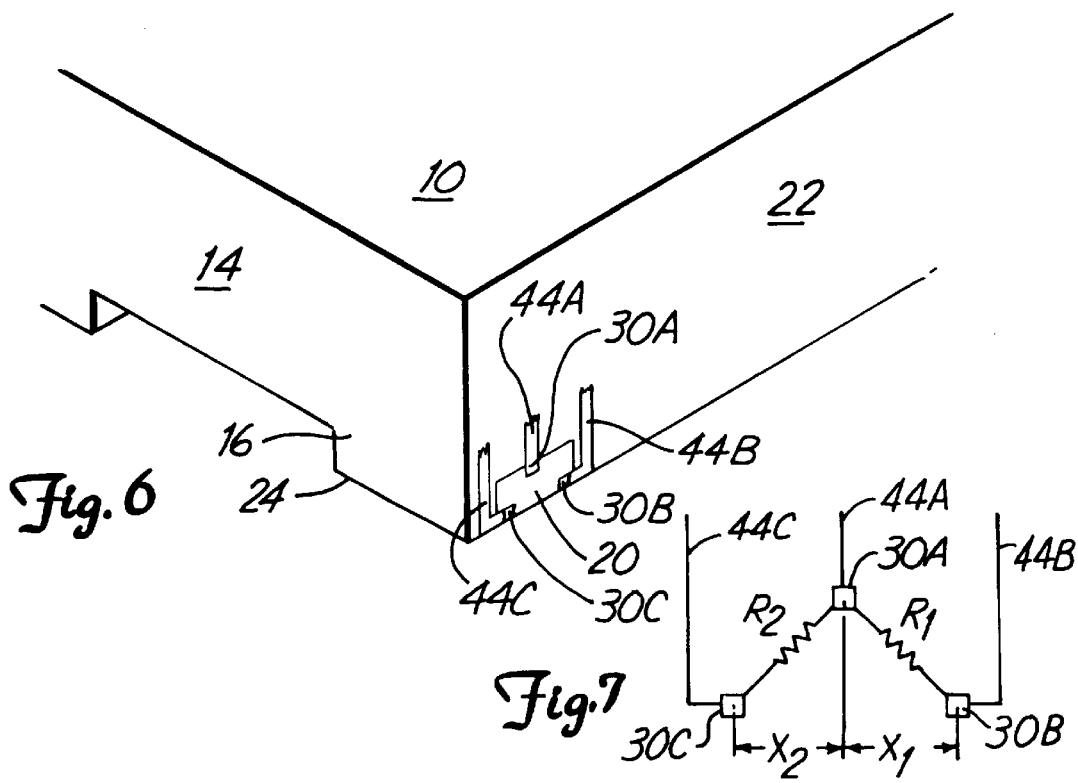

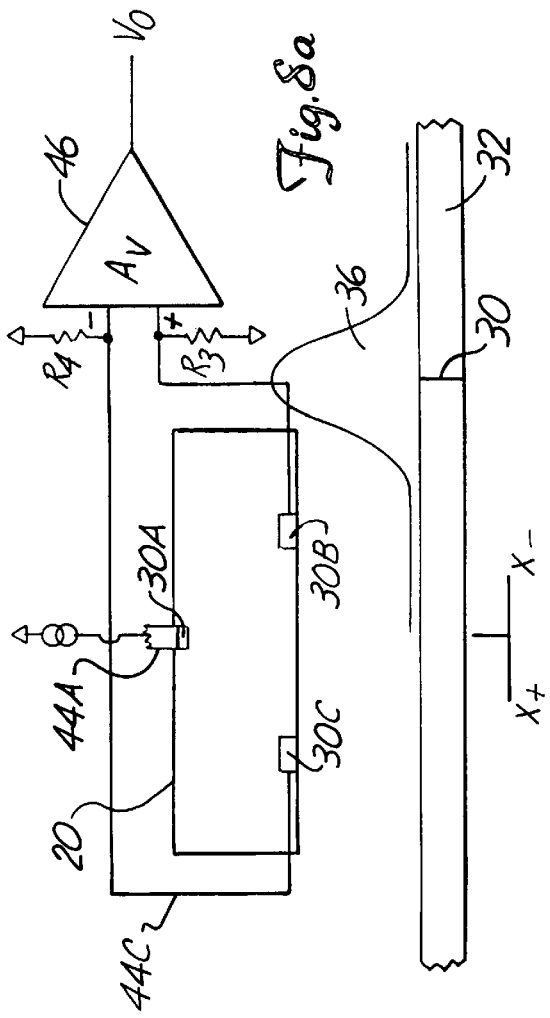
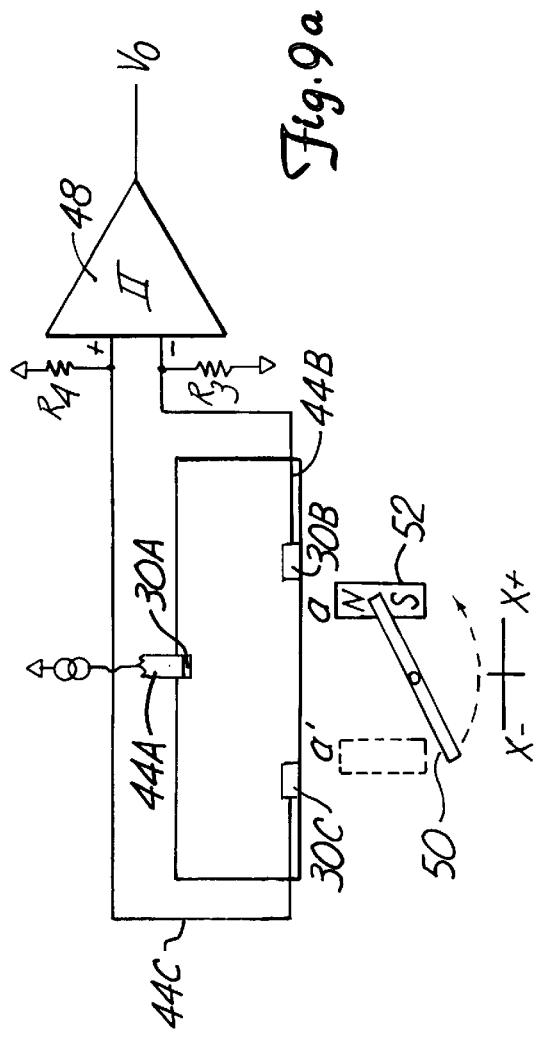
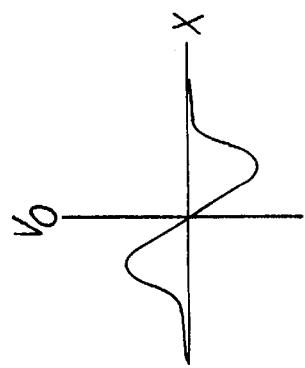
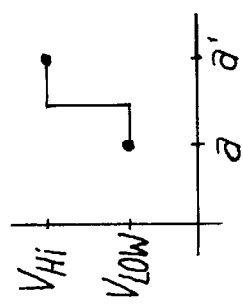

ELECTRIC FIELD MODULATED MR SENSOR

BACKGROUND OF THE INVENTION

The present invention relates to a magnetoresistive head for high data rate applications, and in particular to a magnetoresistive head having a giant magnetoresistive element positioned on a side rail near the trailing edge of a slider for reading information from a magnetic storage medium due to a change in resistance of various positions along a length of the giant magnetoresistive element caused by an applied magnetic field.

Magnetoresistive (MR) sensors are used in magnetic storage systems to detect magnetically encoded information from a magnetic storage medium or disc. A time dependent magnetic field from a magnetic storage medium or disc directly modulates the resistivity of the MR sensor. The change in resistance of the MR sensor can be detected by passing a sense current through the MR sensor and measuring the voltage across the MR sensor. The resulting signal can be used to recover the encoded information from the magnetic storage medium or disc.

Practical MR sensors are typically formed using ferromagnetic metal alloys because of their high magnetic permeability. A ferromagnetic metal alloy is deposited in a thin film upon an electrically insulated substrate or wafer. Changing magnetic fields originating from the magnetic storage medium produce a change in the magnetization direction of the MR sensor and thereby change the resistance of the sensor. This phenomenon is called an MR effect.

MR sensors have a maximum signal-to-noise ratio when the active region of the sensor has no movable magnetic domain boundaries or no domain boundaries. In other words, the active sense area of the MR sensor should be a single domain. The presence of domain boundaries in the sensor active area that move when a field is applied gives rise to Barkhausen noise, a phenomenon caused by the irreversible motion of a magnetic domain in the presence of an applied magnetic field. Barkhausen noise cannot occur if no domain boundaries exist. Typically, a single magnetic domain MR sensor is achieved by either utilizing geometry, or via boundary control stabilization or inherent longitudinal magnetic fields or any combination thereof.

In order to predict the signal output of an MR sensor, it is necessary to know the spatial angular dependence, $\theta(x,y)$, between the current density vector $\bar{J}$ and the magnetization vector $\bar{M}$ of the MR sensor. In general:

$$\theta(x,y) = \cos^{-1}\left(\frac{\bar{M}\cdot\bar{J}}{\bar{M}\,\bar{J}}\right)$$

In traditional MR sensor configurations, the slight dependence of the current density vector $\bar{J}$ on the resistivity of the element; given by $$\rho(\theta) = \rho_o + \Delta\rho\cos^2\theta$$

has been treated as negligible and has been or can be ignored (for example, an MR sensor with contacts perpendicular to the active area). The reason for this is that the fractional change is resistivity as defined by $$\frac{\Delta\rho}{\rho}$$

is relatively small for standard MR sensor configurations, usually less than 3.0 percent. Thus, the dependence of the current density vector $\bar{J}$ on the resistivity of the device $\rho$ is negligible. In many practical MR devices, the change in resistivity as defined by $$\frac{\Delta\rho}{\rho}$$

is even smaller; on the order of 0.5 percent resistivity change to 2.0 percent near room temperature.

Giant MR (GMR) sensors formed from GMR materials are the new line in the family of MR sensors. GMR sensors are formed from GMR elements, which are multi-layered structures. These devices include either layers of ferromagnetic and non-ferromagnetic films or a similar set of films. Permalloy may or may not be part of the layered pattern. In GMR sensors, the change in resistivity as defined by $$\frac{\Delta\rho}{\rho}$$

can be in excess of 65 percent. Therefore, these materials open up the opportunity for a class of sensors in which the current density vector $\bar{J}$ functionally depends on the spatial variation of $\rho(\theta)$ via spatial field gradients. Hence, the dependence of the current density vector $\bar{J}$ on the resistivity of the device $\rho$ is critical.

SUMMARY OF THE INVENTION

One embodiment of the present invention is a magnetoresistive sensor for reading information from a longitudinal track of a magnetic storage medium moving under the sensor. The sensor includes a giant magnetoresistive element positioned on a bottom surface of a side rail located adjacent to the track. With the giant magnetoresistive element, the current density vector $\bar{J}$ can be dynamically adjusted by applying a magnetic field to the element. First, second, and third electrical contacts are spatially and preferably symmetrically positioned on the giant magnetoresistive element and along the track. A first current path having a first variable resistance is formed between the first and second electrical contacts, while a second current path having a second variable resistance is formed between the first and third electrical contacts. The first and second current paths are preferably symmetrically positioned about the first electrical contact. A magnetic field representing information from the track of the magnetic storage medium passes under the giant magnetoresistive element causing a change in the first variable resistance in the first current path when the magnetic field passes under the first current path. Similarly, the magnetic field causes a change in the second variable resistance in the second current path when the magnetic field passes under the second current path. External electrical circuitry can manipulate the various signal changes resulting from these resistance variations, thereby recovering the desired information from the magnetic storage medium. Thus, the property of a giant magnetoresistive sensor allowing for a large change in resistance in the presence of a magnetic field is utilized to unbalance a current flow detectable by external circuitry.

A second embodiment of the present invention is an apparatus for sensing a change in a magnetic field. The apparatus includes a giant magnetoresistive element positioned adjacent to the magnetic field. First, second, and third electrical contacts are spatially positioned on the giant magnetoresistive element forming a first current path having a first variable resistance between the first and second electrical contacts and a second current path having a second variable resistance between the first and third electrical contacts. Preferably, the first and second current paths are symmetrically positioned about the first contact. The magnetic field causes a change in the first resistance in the first current path when the magnetic field passes underneath the first current path, and the magnetic field causes a change in the second resistance in the second current path when the magnetic field passes underneath the second current path.

BRIEF DESCRIPTION OF THE DRAWINGS

FIG. 4 is a diagrammatic view of a giant magnetoresistive element.

FIG. 5 is a side view of a giant magnetoresistive element and a track of a magnetic storage medium moving thereunder.

FIG. 6 is a greatly enlarged diagrammatic view of the trailing edge of a slider incorporating the present invention.

FIG. 7 is a diagrammatic representation of the contacts of a giant magnetoresistive element and the resistance paths between the contacts.

FIG. 8A is a diagrammatic view showing the present invention incorporated into a first electrical circuit.

FIG. 8B is a graph showing the output voltage of the electrical circuit of FIG. 8A as a function of the position of a transition from a magnetic storage medium.

FIG. 9A is a diagrammatic view showing the present invention incorporated into a second electrical circuit.

FIG. 9B is a graph showing the output voltage of the electrical circuit of FIG. 9A as a function of the position of a magnetic medium.

DETAILED DESCRIPTION OF THE PREFERRED EMBODIMENTS

Figure 1:
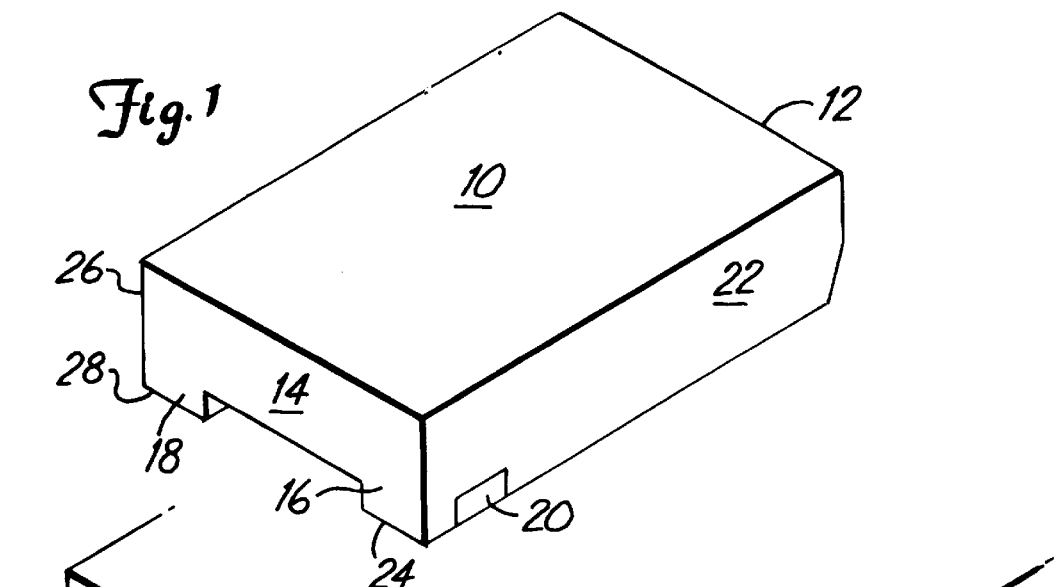
FIG. 1 is a diagrammatic view of a slider containing a giant magnetoresistive element.

FIG. 1 is a diagrammatic view of slider 10. Slider 10 includes leading edge 12, trailing edge 14, first side rail 16, second side rail 18, and giant magnetoresistive (GMR) element 20. First side rail 16 includes outer surface 22 and bottom surface 24, while second side rail 18 includes outer surface 26 and bottom surface 28.

In operation, slider 10 having GMR element 20 positioned on first side rail 16 is attached to an arm of a disc drive system and used for recording information to and reading information from a magnetic storage medium or disc. In an alternate embodiment, a second GMR element, similar to GMR element 20, is positioned on second side rail 18.

Figure 2:
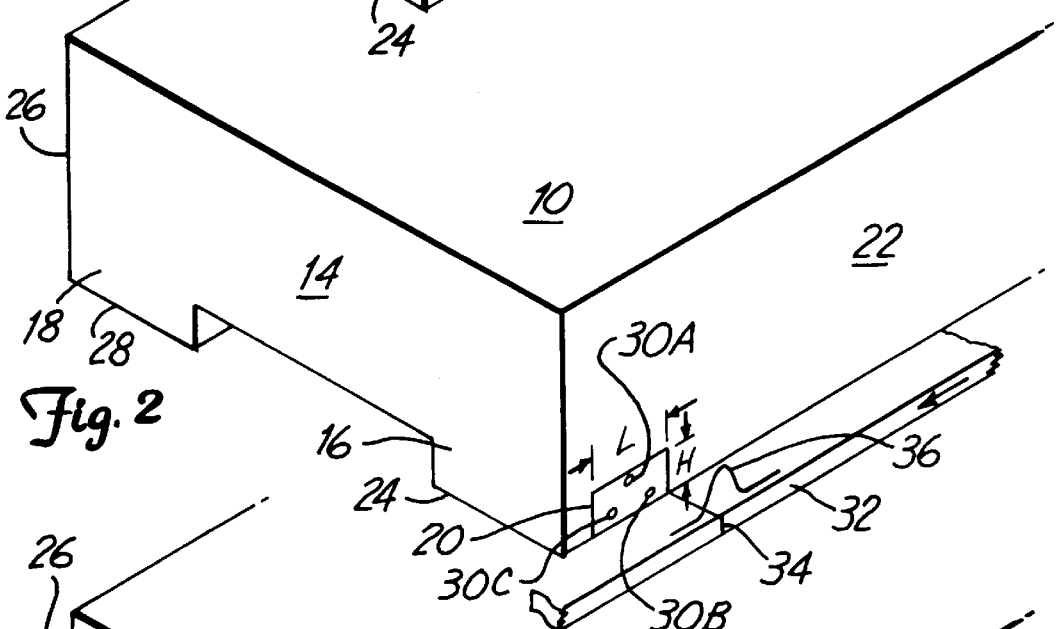
FIG. 2 is a greatly enlarged diagrammatic view of the trailing edge of a slider incorporating a first embodiment of the present invention.

FIG. 2 is a greatly enlarged diagrammatic view of trailing edge 14 of slider 10 incorporating a first embodiment of the present invention. Slider 10 shown in FIG. 2 includes trailing edge 14, first side rail 16 having outer surface 22 and bottom surface 24, second side rail 18 having outer surface 26 and bottom surface 28, and GMR element 20.

As shown in FIG. 2, GMR element 20 includes electrical contacts 30A, 30B, and 30C and has length L and height H. Due to the resistive nature of GMR element 20, a first current path is formed between electrical contacts 30A and 30B, and a second current path is formed between contacts 30A and 30C. Electrical leads (not shown in FIG. 2) are used to connect electrical contacts 30A, 30B, and 30C to external circuitry.

In operation, slider 10 is positioned above a moving magnetic storage medium or disc. The magnetic storage medium or disc contains a series of data tracks, one of which is represented by track 32. Track 32 contains a series of longitudinal transitions 34. Each transition on track 32 represents a particular piece of data stored on track 32 and has a magnetic field associated with it. Magnetic field 36 (shown in FIG. 2) is associated with longitudinal transition 34 and denotes the vertical field profile as a function of the distance from transition 34. Track 32 moves in the direction from leading edge 12 to trailing edge 14 of slider 10, as shown by the arrow in FIG. 2.

As magnetic field 36 associated with transition 34 passes under the first current path formed between electrical contacts 30A and 30B, the resistance within the first current path decreases due to the properties of GMR element 20. Similarly, as magnetic field 36 representing transition 34 passes under the second current path formed between electrical contacts 30A and 30C, the resistance in the second current path decreases while the resistance in the first path increases to its base resistance. These changes in resistance can be manipulated by external circuitry connected to electrical contacts 30A, 30B, and 30C.

Figure 3:
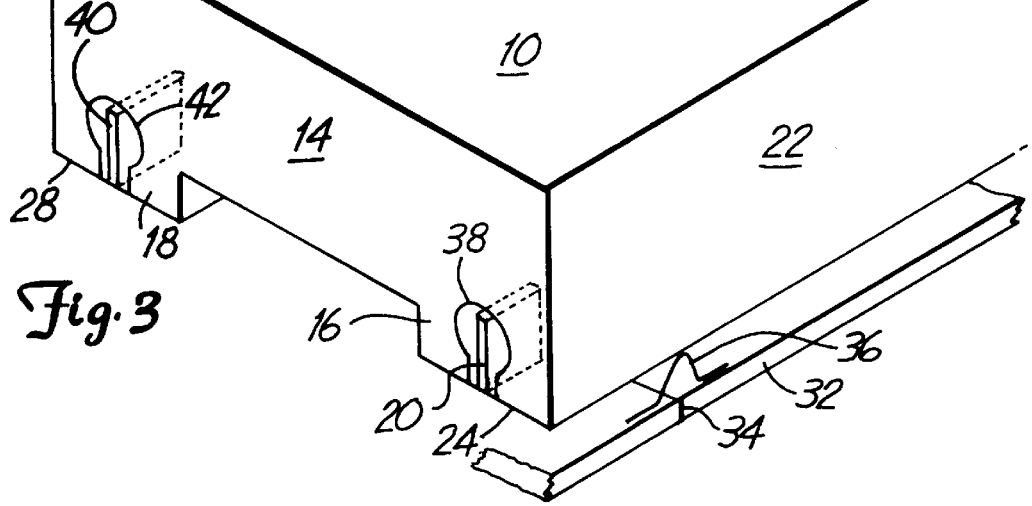
FIG. 3 is a greatly enlarged diagrammatic view of the trailing edge of a slider incorporating a second embodiment of the present invention.

FIG. 3 is a greatly enlarged diagrammatic view of trailing edge 14 of slider 10 incorporating a second embodiment of the present invention. The embodiment shown in FIG. 3 is another example of a composite structure permitting a conventional writer structure (not shown in FIG. 3) to be added. Slider 10, as shown in FIG. 3, is identical to the slider shown in FIG. 2, except that GMR element 20 is no longer positioned on outer surface 22 of first side rail 16. Rather, first GMR element 20 is located within core 38 positioned on trailing edge 14 of first side rail 16, and second GMR element 40 is located within core 42 positioned on trailing edge 14 of second side rail 18. GMR element 40 includes contacts (not shown) similar to contacts 30A, 30B, and 30C of GMR element 20. GMR elements 20 and 40 are identical; therefore, for simplicity, only GMR element 20 will be further discussed.

As shown in FIGS. 2 and 3, GMR element 20 is positioned such that the length of GMR element 20 is substantially parallel to track 32 moving under first side rail 16. This positioning, and the position of contacts 30A, 30B, and 30C permit a large change in resistance within the first and second current paths as magnetic field 36 passes thereunder, thereby unbalancing a current flow detectable by external circuitry.

FIG. 4 is a diagrammatic view of GMR element 20. GMR element 20 differs from a normal MR element in that GMR element 20 includes either layers of ferromagnetic and non-ferromagnetic films or a similar pattern of films. Standard permalloy may be part of the pattern. The novel composition of GMR element 20 provides that the change in resistivity of GMR element 20 can be significantly modulated by the movement of a magnetic field. By properly positioning electrical contacts 30A, 30B, and 30C, it is possible to change the resistance in the first and second current paths formed by contacts 30A, 30B, and 30C. This change in resistance can then be manipulated by external circuitry to decode transition 34 located on track 32 associated with magnetic field 36.

Contacts 30A, 30B, and 30C can be positioned anywhere along thickness T of GMR element 20. In one preferred embodiment, contacts 30A, 30B, and 30C are positioned on an outer surface of GMR element 20 as shown in FIG. 4. Conversely, contacts 30A, 30B, and 30C must be spatially positioned along length L of GMR element 20 in order to transduce the modulated resistivity of GMR element 20. In one preferred embodiment, contacts 30B and 30C are symmetrically positioned along length L of MR element 20 about contact 30A, thereby forming an isosceles triangle. With this type of design, differing resistances due to differing lengths of current paths are eliminated. Therefore, any resistance changes and associated current splitting should be a result of a moving transition located under the MR element.

If contact 30A is positioned directly above or below either contacts 30B or 30C, moving magnetic field 36 (shown in FIGS. 2 and 3) would not cause a substantial change in resistance in the appropriate current path due to the contact alignment as the transition moves past the sensor. Thus, it is best that contacts 30A, 30B, and 30C are spatially positioned along length L of GMR element 20 and that contact 30A is positioned at a height different from the height from both contacts 30B and 30C. In one preferred embodiment, the first and second current paths are symmetrically positioned about first contact 30A.

FIG. 5 is a side view of GMR element 20 and track 32 of a magnetic storage medium moving thereunder. Track 32 is moving in a direction as shown by the arrow in FIG. 5. In operation, while track 32 is moving, transition 34 and associated magnetic field 36 move under GMR element 20.

When transition 34 and associated magnetic field 36 becomes positioned between first contact 30A and second contact 30B, magnetic field 36 causes a decrease in resistance in a first current path between contacts 30A and 30B. This decrease in resistance can be detected by external circuitry by passing a current through a first contact path formed between contacts 30A and 30B. Likewise, when transition 34 and associated field 36 moves to a position between first contact 30A and third contact 30C, the resistance in the second current path formed by contacts 30A and 30C decreases and the resistance in the first current formed by contacts 30A and 30B path increases due to the absence of the magnetic field between contacts 30A and 30B. This change in resistance can be detected by external circuitry by passing a current through second contact path formed by contacts 30A and 30C, thereby decoding transition 34.

FIG. 6 is a greatly enlarged diagrammatic view of trailing edge 14 of slider 10 incorporating a first embodiment of the present invention. FIG. 6 shows electrical leads 44A, 44B, and 44C connected to contacts 30A, 30B, and 30C, respectively. Electrical leads 44A, 44B, and 44C provide the current path from external circuitry (not shown in FIG. 6) to contacts 30A, 30B, and 30C. Although contacts 30A, 30B, and 30C are shown on the outside surface of GMR element 20, these contacts can be positioned throughout the width of GMR element 20.

FIG. 7 is a diagrammatic representation of contacts 30A, 30B, and 30C and the resistance paths between the contacts. When any magnetic field becomes positioned between contacts 30A and 30B, resistance $R_1$ will decrease. This decrease in resistance of $R_1$ is caused by the properties of the GMR element having a plurality of ferromagnetic and non-ferromagnetic layers and can be detected and manipulated by external circuitry connected to electrical leads 44A and 44B. Likewise, when a magnetic field becomes positioned between contacts 30A and 30C, resistance $R_2$ decreases. This decrease in resistance can be detected and manipulated by external circuitry connected to contacts 44A and 44C. External circuitry can utilize these changes in resistances of $R_1$ and $R_2$ for a variety of purposes, as discussed below.

FIG. 8A is a diagrammatic view showing the present invention incorporated into a first electrical circuit. FIG. 8A includes GMR element 20, contacts 30A, 30B and 30C, electrical leads 44A, 44B, and 44C, resistors $R_3$ and $R_4$, having identical resistances, and differential amplifier 46. GMR element 20 is normally positioned on slider 10, either on outer surface 22 of first side rail 16, as shown in FIG. 2, or in core 38 of FIG. 3. FIG. 8B is a graph showing the output voltage of differential amplifier 46 as a function of the position of transition 34 and associated magnetic field 36.

In operation, track 32 of a magnetic storage medium or disc is moving underneath slider 10 having GMR element 20 positioned near trailing edge 14. As transition 34 and associated magnetic field 36 move, they eventually become positioned between contacts 30A and 30B. At this point, the resistance in the first current path between contacts 30A and 30B decreases due to the properties of GMR element 20. With a supplied current, the decrease in resistance causes an increase in the current flowing through the first current path from contact 30A to contact 30B, as compared to the current flow through the second current path from contact 30A to contact 30C. This increase in current through the first current path provides a greater voltage drop across resistor $R_3$ than the voltage drop across resistor $R_4$. The difference in voltage drop across resistors $R_3$ and $R_4$ is amplified by differential amplifier 46, producing a positive output voltage $V_0$. This output voltage is shown on the left side of FIG. 8B.

Eventually, transition 34 and associated magnetic field 36 becomes positioned directly under contact 30A. At this point, the change in resistance in the first current path between contacts 30A and 30B will be equal to the change in resistance in the second current path between contacts 30A and 30C. Therefore, there will be no differential voltage drop across resistors $R_3$ and $R_4$. Hence, there will be no output voltage $V_0$ of differential amplifier 46. This data position is represented in FIG. 8B where x=0, and thus, the output voltage of differential amplifier 46 equals 0.

As transition 34 and associated magnetic field 36 continue to move under GMR element 20, transition 34 and associated magnetic field 36 will eventually be positioned substantially under the second current path between contacts 30A and 30C. The resistance in the second current path will decrease and the resistance in the first current path will increase, hence, causing more current flow through the second current path than through the first current path. This increase in current through the second current path will in turn cause a increase in the voltage across resistor $R_4$. The difference in voltage drop across resistors $R_3$ and $R_4$ is amplified by differential amplifier 46, producing a negative output voltage $V_0$. This output voltage is shown on the right side of FIG. 8B by the negative output voltage.

Finally, transition 34 and associated magnetic field 36 will move such that magnetic field 36 is no longer positioned under either the first contact path between contacts 30A and 30B or the second contact path positioned between contacts 30A and 30C. At this point, the voltage drop across resistor $R_3$ will be substantially equal to the voltage drop across resistor $R_4$ and the gain of differential amplifier 46 will be zero or nominal. The output will continue to be zero or nominal until new data having a separate magnetic field begins to pass under GMR element 20.

FIG. 9A is a diagrammatic view showing the present invention incorporated into a second electrical circuit. FIG. 9A includes GMR element 20, contacts 30A, 30B, and 30C, electrical leads 44A, 44B, and 44C, resistors $R_3$ and $R_4$, having substantially identical resistances, and comparitor 48. In one preferred embodiment, comparitor 48 is a Schmitt trigger (ie. a comparitor with hysteresis). FIG. 9B is a graph showing the output voltage of comparitor 48 of FIG. 9A as a function of the position of magnetic switch 50.

In operation, magnetic switch 50 is movable from position "a" to position "a'". When magnetic switch 50, having magnet 52 attached thereto, is in position "a", the resistance in the first current path between contacts 30A and 30B is low due to the properties of GMR element 20. With a supplied current, the low resistance in resistivity causes an increase in the current flow through the first current path from contact 30A to contact 30B, as compared to the current flow through the second current path from contact 30A to contact 30C. This increase in current through the first current path provides a greater voltage drop across resistor $R_3$ then the voltage drop across resistor $R_4$. Comparitor 48 interprets this voltage differential and provides a low voltage output, as shown in FIG. 9B.

When magnetic switch 50 is located at "a'", the resistance of the second current path will decrease and the resistance of the first current path will increase, hence, causing more current flow through the second current path than through the first current path. This increase in current through the second current path will in turn cause an increase in the voltage across resistor $R_4$. The difference in voltage across resistors $R_3$ and $R_4$ is detected by comparitor 48, thereby producing a high voltage output, as shown in FIG. 9B. Therefore, this embodiment of the present invention can be used as a common switch. However, when used as a switch, the embodiment incorporating the present invention shown in FIG. 9A has no movable contacting parts which could wear out or break and no electrical contacts which could generate a spark-causing potential explosion in hazardous applications.

Although the present invention has been described with reference to preferred embodiments, workers skilled in the art will recognize that changes may be made in form and detail without departing from the spirit and scope of the invention.

What is claimed is:

1. A sensor for reading information from one of a plurality of longitudinal tracks of a magnetic storage medium moving underneath the sensor, the sensor comprising:

a slider having a side rail, the side rail having a bottom surface, wherein the slider is arranged to position the bottom surface of the side rail adjacent a first track of the plurality of longitudinal tracks;

a giant magnetoresistive element positioned on the bottom surface of the side rail;

first, second and third electrical contacts spatially positioned on the giant magnetoresistive element and along the first track such that a first current path having a first variable resistance is formed between the first and second electrical contacts and a second current path having a second variable resistance is formed between the first and third electrical contacts; and wherein a first magnetic field representing information from the first track passes the first, second and third electrical contacts at different times causing a change in the first variable resistance in the first current path when the first magnetic field becomes positioned substantially underneath the first current path, and wherein the first magnetic field causes a change in the second variable resistance in the second current path when the first field becomes positioned substantially underneath the second current path.

2. The sensor of claim 1 wherein movement of the first magnetic field from a first position underneath the first current path to a second position underneath the second current path causes the first variable resistance to increase and causes the second variable resistance to decrease.

3. The sensor of claim 1 wherein the slider further comprises:

a leading edge;

a trailing edge; and wherein the giant magnetoresistive element is positioned closer to the trailing edge of the slider than the leading edge of the slider.

4. The sensor of claim 3 wherein the giant magnetoresistive element is positioned near the trailing edge of the slider in a core.

5. The sensor of claim 1 wherein the side rail further comprises:

an outer surface; and wherein the giant magnetoresistive element is positioned on the outer surface of the side rail.

6. The sensor of claim 1 wherein the giant magnetoresistive element comprises a plurality of varying strips of material.

7. The sensor of claim 6 wherein the first electrical contact is positioned on a first strip of material and the second electrical contact is positioned on a second strip of material, and wherein the first strip of material is different from the second strip of material.

8. The sensor of claim 7 wherein the third electrical contact is positioned on a third strip of material, and wherein the first strip of material is different from the third strip of material.

9. The sensor of claim 6 wherein the plurality of varying strips of material further comprises:

layers of ferromagnetic and non-ferromagnetic material.

10. The sensor of claim 1 wherein the slider further comprises:

a second side rail having a bottom surface, wherein the slider is arranged to position the bottom surface of the second side rail adjacent a second track of the plurality of longitudinal tracks.

11. The sensor of claim 10 and further comprising:

a second giant magnetoresistive element positioned on the bottom surface of the second side rail, fourth, fifth, and sixth electrical contacts spatially positioned along the length of the second giant magnetoresistive element and along the second track such that a third current path having a third variable resistance is formed between the fourth and fifth electrical contacts and a fourth current path having a fourth variable resistance is formed between the fourth and sixth electrical contacts; and wherein a second magnetic field representing information from the second track passes the fourth, fifth and sixth electrical contacts at different times causing a change in the third variable resistance in the third current path when the second magnetic field becomes positioned substantially under the third current path, and wherein the second magnetic field from the second track causes a change in the fourth variable resistance in the fourth current path when the second magnetic field becomes positioned substantially under the fourth current path.

12. The sensor of claim 11 wherein the slider further comprises:

a leading edge:

a trailing edge; and wherein the second giant magnetoresistive element is positioned closer to the trailing edge of the slider than the leading edge of the slider.

13. The sensor of claim 11 wherein the side rail further comprises:

an outer surface; and wherein the second giant magnetoresistive element is positioned on the outer surface of the second side rail.

14. The sensor of claim 12 wherein the second giant magnetoresistive element is positioned near the trailing edge of the slider in a core.

15. The sensor of claim 11 wherein the second giant magnetoresistive element comprises a plurality of varying strips of material.

16. The sensor of claim 15 wherein the fourth electrical contact is positioned on a fourth strip of material and the fifth electrical contact is positioned on a fifth strip of material, and wherein the fourth strip of material is different from the fifth strip of material.

17. The sensor of claim 16 wherein the sixth electrical contact is positioned on a sixth strip of material, and wherein the fourth strip of material is different from the sixth strip of material.

18. The element of claim 15 wherein the plurality of varying strips of material further comprises:

layers of ferromagnetic and non-ferromagnetic material.

19. An apparatus for sensing a movement in a magnetic field, the apparatus comprising:

a giant magnetoresistive element;

first, second, and third electrical contacts spatially positioned on the giant magnetoresistive element and along the first track such that a first current path in the giant magnetoresistive element is formed having a first variable resistance between the first and second electrical contacts and a second current path in the giant magnetoresistive element is formed having a second variable resistance between the first and third electrical contacts; and wherein the magnetic field pass the first, second and third electrical contacts at different times causing a change in the first variable resistance in the first current path when the field becomes positioned substantially underneath the first current path, and wherein the magnetic field causes a change in the second variable resistance in the second current path when the field becomes positioned substantially underneath the second current path.

20. The apparatus of claim 19 wherein the first variable resistance decreases when the magnetic field is substantially positioned underneath the first current path, and wherein the second variable resistance decreases when the magnetic field is substantially positioned underneath the second current path.

* * * * *